US009287273B2

(12) United States Patent
Ragnarsson et al.

(10) Patent No.: US 9,287,273 B2
(45) Date of Patent: Mar. 15, 2016

(54) METHOD FOR MANUFACTURING A SEMICONDUCTOR DEVICE COMPRISING TRANSISTORS EACH HAVING A DIFFERENT EFFECTIVE WORK FUNCTION

(71) Applicant: IMEC VZW, Leuven (BE)

(72) Inventors: Lars-Ake Ragnarsson, Leuven (BE); Tom Schram, Rixensart (BE); Hendrik F. W. Dekkers, Tienen (BE); Soon Aik Chew, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/733,880

(22) Filed: Jun. 8, 2015

(65) Prior Publication Data
US 2015/0357244 A1    Dec. 10, 2015

(30) Foreign Application Priority Data

Jun. 6, 2014   (EP) ..................... 14171559

(51) Int. Cl.
*H01L 21/8234* (2006.01)
*H01L 27/112* (2006.01)

(52) U.S. Cl.
CPC .................... *H01L 27/112* (2013.01)

(58) Field of Classification Search
CPC .................. H01L 21/823462; H01L 27/112
USPC .......................................... 438/275; 257/316
See application file for complete search history.

(56) References Cited

U.S. PATENT DOCUMENTS

| 6,586,305 | B2 * | 7/2003 | Graf .................. H01L 21/76897 257/E21.507 |
| 7,160,767 | B2 | 1/2007 | Brask et al. |
| 7,183,184 | B2 | 2/2007 | Doczy et al. |
| 7,563,678 | B2 * | 7/2009 | Koyama .......... H01L 21/823842 257/E21.637 |
| 7,985,690 | B2 | 7/2011 | Thei et al. |
| 8,129,280 | B2 | 3/2012 | Wang et al. |
| 8,536,654 | B2 | 9/2013 | Chambers et al. |
| 8,569,135 | B2 * | 10/2013 | Guo .................... H01L 29/4958 257/369 |
| 2005/0272191 | A1 | 12/2005 | Shah et al. |
| 2005/0287746 | A1 | 12/2005 | Metz et al. |
| 2010/0301427 | A1 | 12/2010 | Lenski et al. |
| 2012/0309181 | A1 | 12/2012 | Machkaoutsan et al. |
| 2013/0157449 | A1 | 6/2013 | Cao et al. |
| 2013/0200467 | A1 | 8/2013 | Edge et al. |
| 2014/0054717 | A1 | 2/2014 | Edge et al. |

(Continued)

OTHER PUBLICATIONS

Extended European Search Report dated Nov. 24, 2014 in European Patent Application No. EP14171559.9.

*Primary Examiner* — Jami M Valentine
(74) *Attorney, Agent, or Firm* — Knobbe, Martens, Olson & Bear LLP

(57) ABSTRACT

The disclosed technology generally relates a semiconductor device comprising transistors, and more particularly to a semiconductor device comprising transistors each having a gate stack with a different effective work function, and methods of fabricating such a device. In one aspect, the method of fabricating the semiconductor comprises providing at least two channel regions in the substrate and providing a dielectric layer on the substrate. The method additionally includes forming a plurality of gate regions by providing openings in the dielectric layer. The method further includes providing a gate dielectric layer in the openings and providing on the gate dielectric layer of each of the gate regions a barrier layer stack having different thickness along the different gate regions.

12 Claims, 7 Drawing Sheets

Pattern photoresist

(56) References Cited

U.S. PATENT DOCUMENTS

| | | | |
|---|---|---|---|
| 2014/0227843 A1* | 8/2014 | Tsukamoto | H01L 29/6659 438/275 |
| 2015/0118813 A1* | 4/2015 | Tsukamoto | H01L 29/6659 438/275 |
| 2015/0249145 A1* | 9/2015 | Yoshimori | H01L 29/66545 438/275 |

* cited by examiner

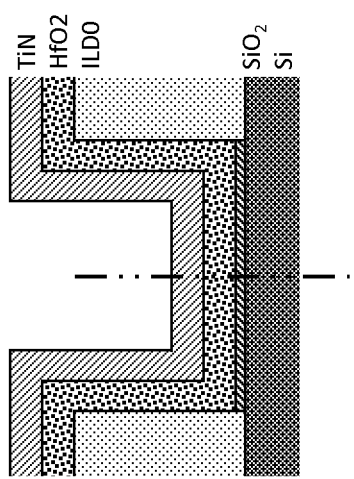
Deposit barrier (TiN)
FIG. 1.1
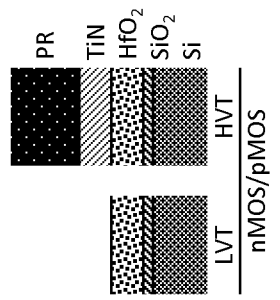
Coat with photoresist
FIG. 1.2.a
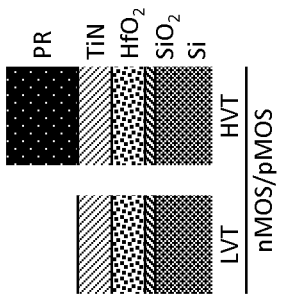
Pattern photoresist
FIG. 1.2.b
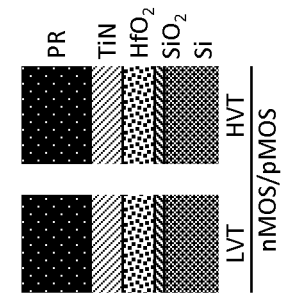
Dry etch TiN with $SF_6$
FIG. 1.2.c
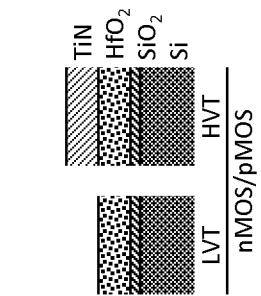
Strip photoresist
FIG. 1.2.d
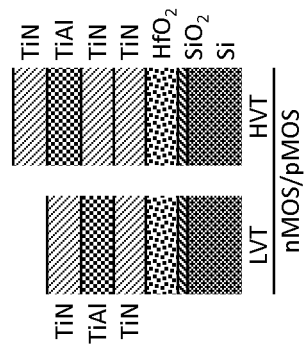
Deposit TiN/TiAl/TiN
FIG. 1.3

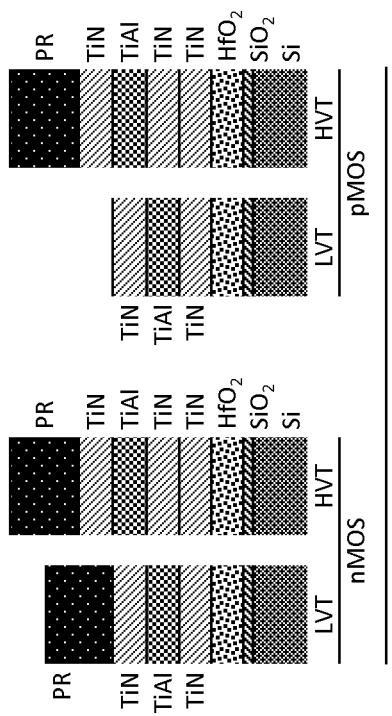
Pattern photoresist
FIG. 1.4.b
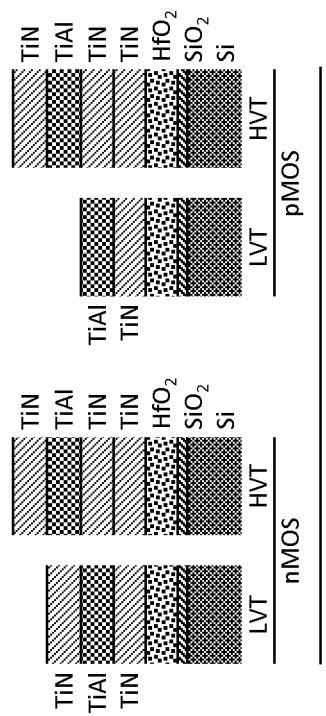
Strip photoresist
FIG. 1.4.d
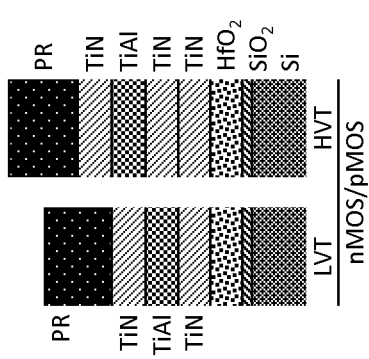
Coat with photoresist
FIG. 1.4.a
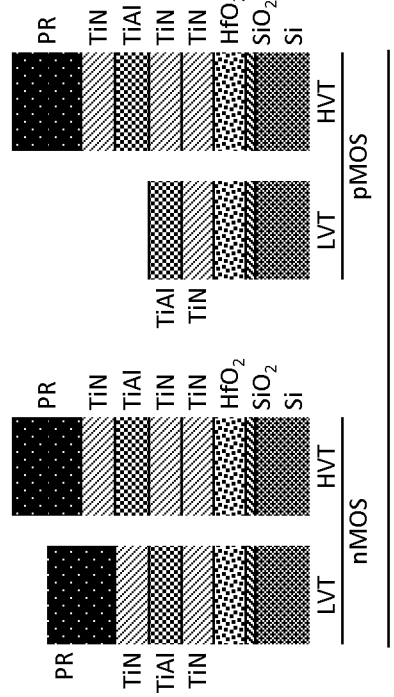
Dry Etch TiN with $SF_6$
FIG. 1.4.c

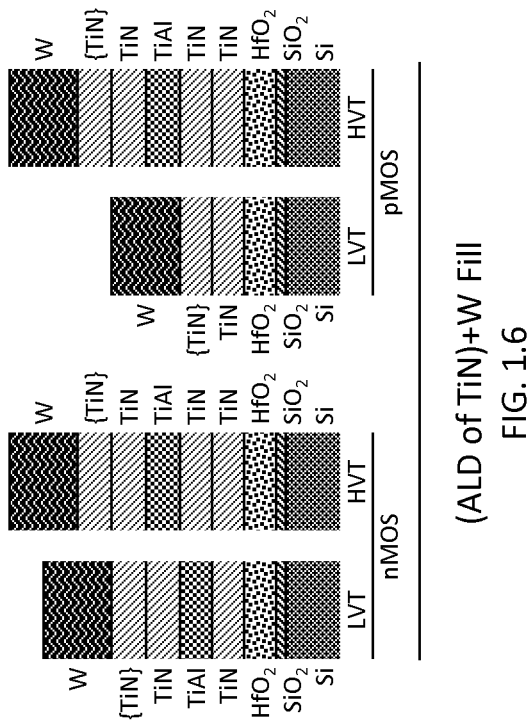
Etch TiAl (using, e.g. TMAH)
FIG. 1.5
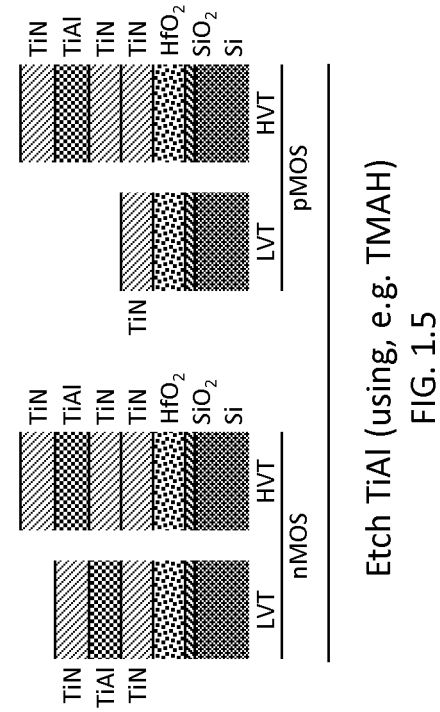
(ALD of TiN)+W Fill
FIG. 1.6

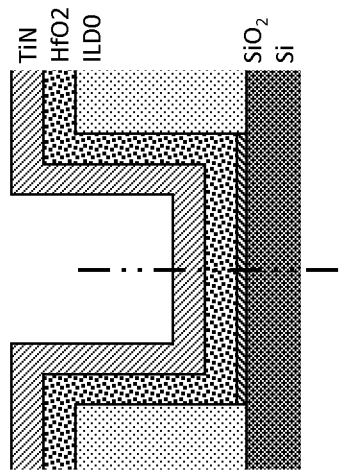
Deposit Barrier (TiN)
FIG. 2.1
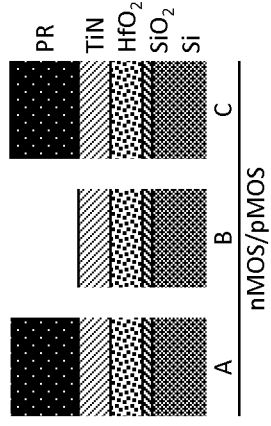
Coat with photoresist
FIG. 2.2.a
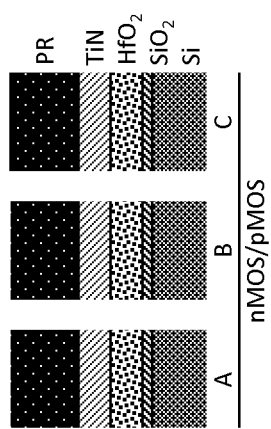
Pattern Photoresist
FIG. 2.2.b
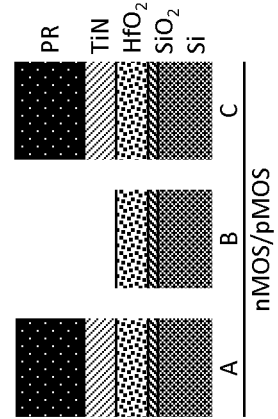
Dry Etch TiN in SF$_6$
FIG. 2.2.c
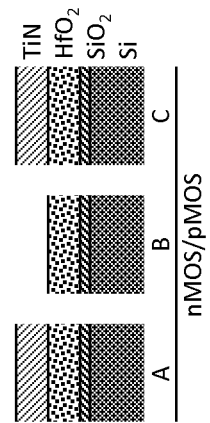
Strip photoresist
FIG. 2.2.d

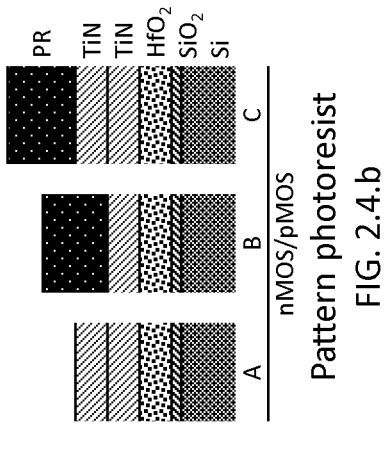
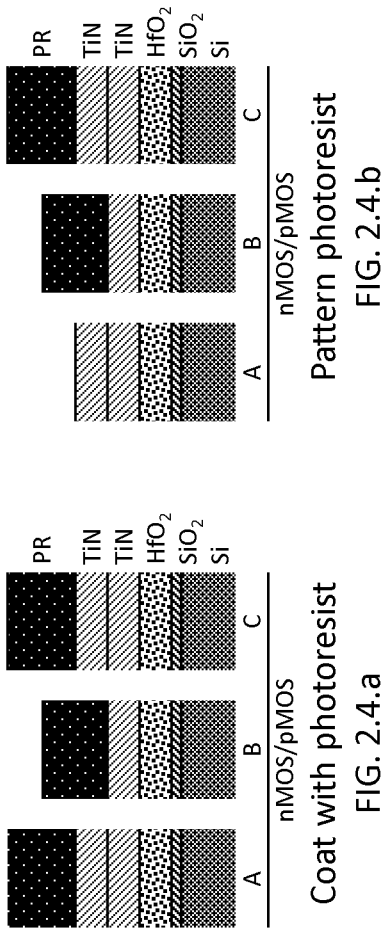
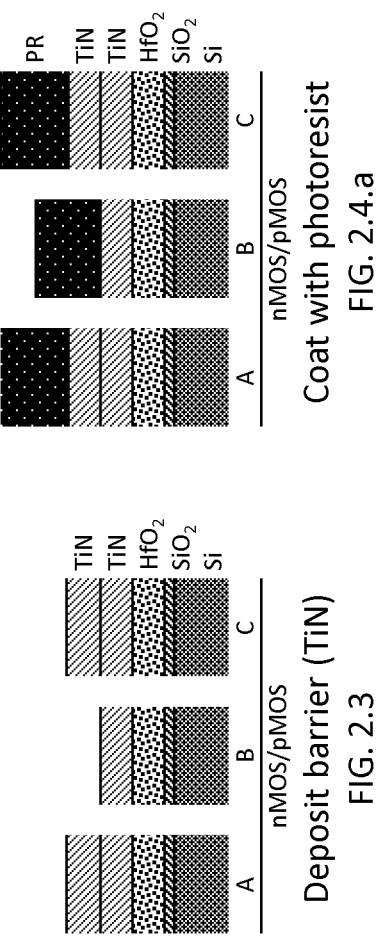
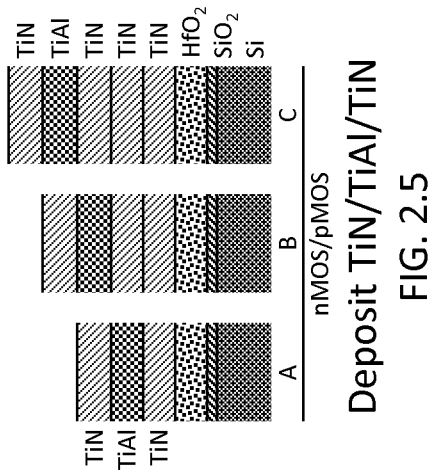
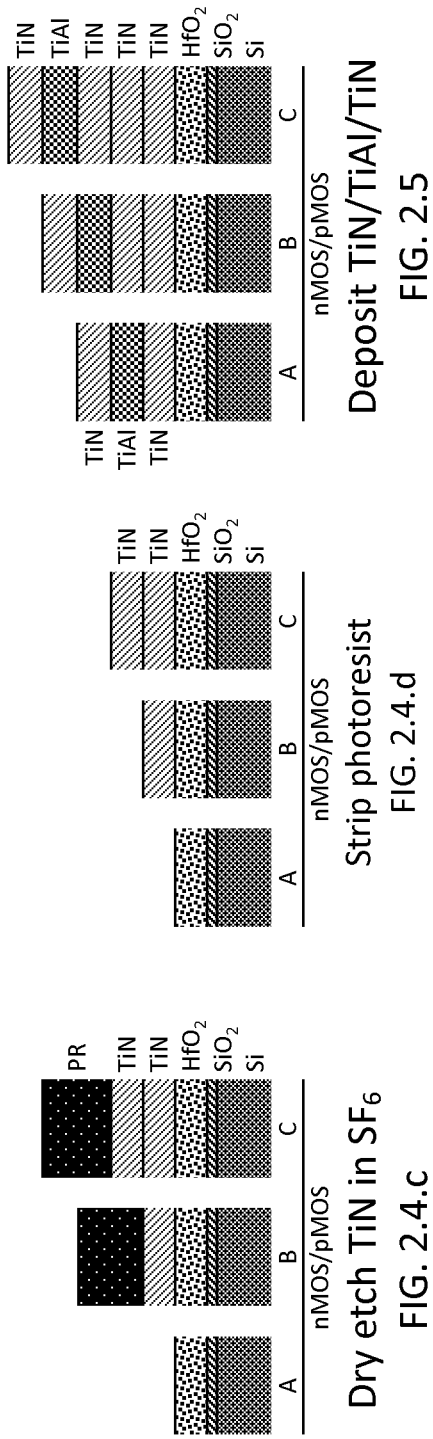

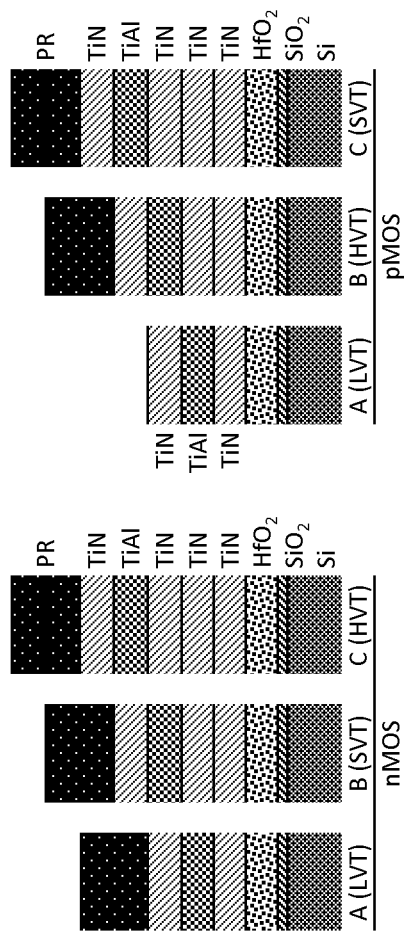
Pattern photoresist
FIG. 2.6.b
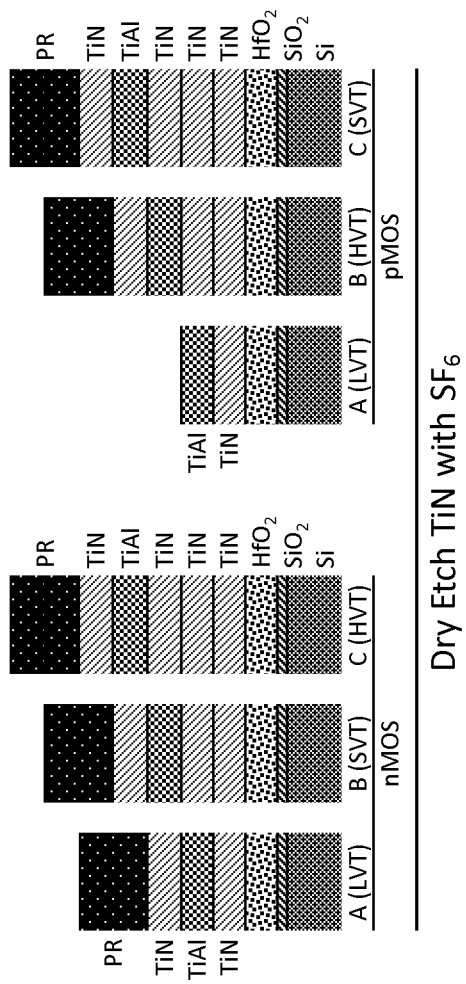
Dry Etch TiN with SF$_6$
FIG. 2.6.c
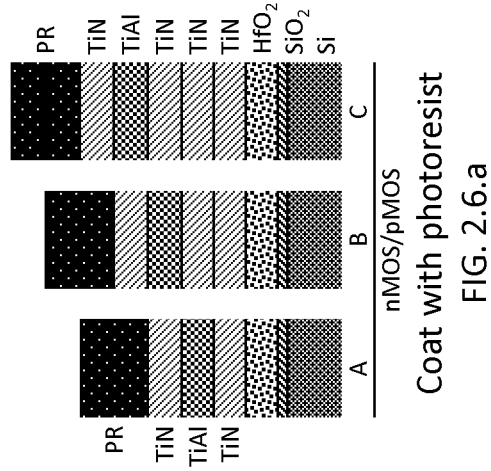
Coat with photoresist
FIG. 2.6.a

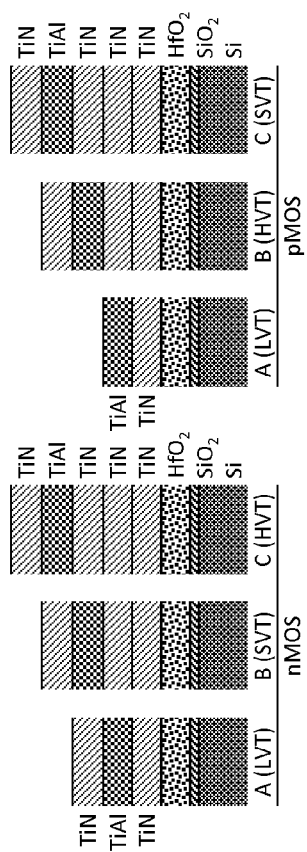
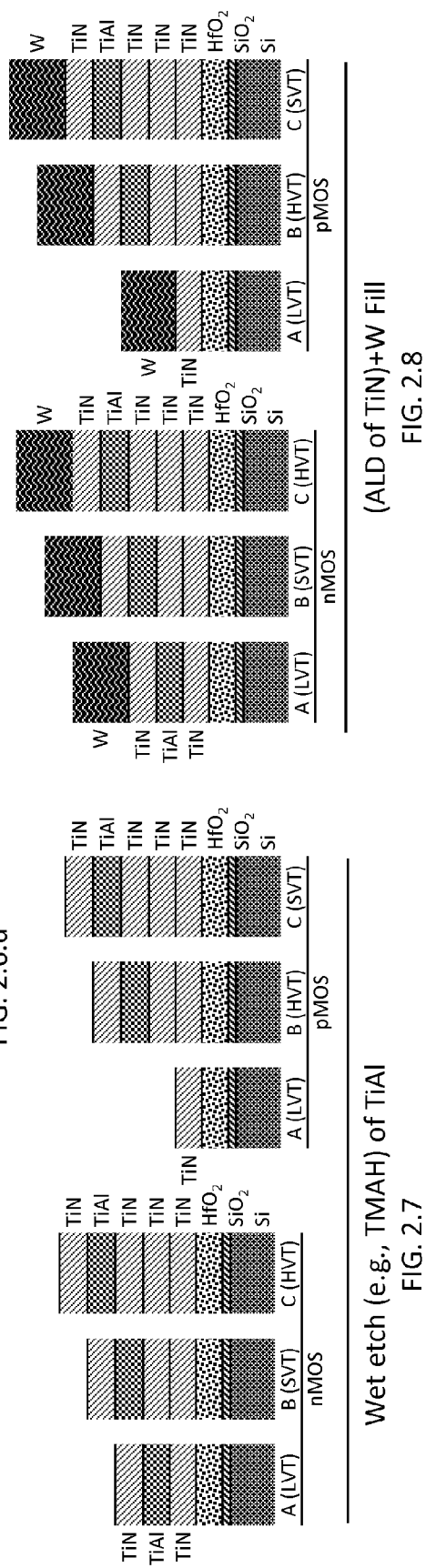
Strip photoresist
FIG. 2.6.d
Wet etch (e.g., TMAH) of TiAl
FIG. 2.7
(ALD of TiN)+W Fill
FIG. 2.8

METHOD FOR MANUFACTURING A SEMICONDUCTOR DEVICE COMPRISING TRANSISTORS EACH HAVING A DIFFERENT EFFECTIVE WORK FUNCTION

CROSS-REFERENCE TO RELATED APPLICATIONS

This application claims foreign priority to European application EP 14171559.9, filed Jun. 6, 2014, the content of which is incorporated by reference herein in its entirety.

BACKGROUND

1. Field

The disclosed technology generally relates to a semiconductor device comprising transistors, and more particularly to a semiconductor device comprising transistors each having a gate stack with a different effective work function.

2. Description of the Related Technology

Some semiconductor devices have complementary metal-oxide-semiconductor field effect transistors (MOSFETs). A MOSFET device can be characterized by a threshold voltage ($V_T$), which refers to a voltage on a gate of the MOSFET which renders the channel of the MOSFET conductive. Processes for fabricating the complementary MOSFETs, also referred to as complementary MOS (CMOS) processes, include processes for fabricating both n-channel (NMOS) and p-channel (PMOS) MOS transistors. The threshold voltage $V_T$ of a MOSFET is influenced by, among other parameters, what is known in the industry and referred to herein as an effective work function ($WF_{eff}$). The effective work function refers to the work function of a gate electrode which takes into account of a flat band voltage (Vfb) of the gate stack while ignoring any contribution to the same Vfb from charges or dipoles in the gate-stack. WFeff therefore, may not be equivalent to the metal vacuum work function which is a physical characteristic of the metal. In some CMOS technologies, threshold voltage ($V_T$) values of the PMOS and NMOS MOSFETs can be engineered by independently controlling the effective work function of the respective PMOS and NMOS gate materials (gate stacks) and their corresponding channel regions through relatively independent channel processing and gate processing. Because the gate dielectric can affect the channel regions, both the gate dielectric (including, e.g., a host dielectric and possible different capping layers) and the gate electrode (including, e.g., at least one metal layer) determine the effective work function ($WF_{eff}$) of the gate stack. Moreover, the gate processing itself (i.e. the sequence of the different processes and/or the thermal treatments applied) may have an influence on the effective work function of the gate stack (device) (WFeff). By adjusting the $WF_{eff}$, the $V_T$ of the device can be adjusted. Generally, a higher WFeff results in higher/lower nMOS/pMOS $V_T$ respectively, while a lower WFeff results in lower/higher nMOS/pMOS $V_T$, respectively.

For some applications, CMOS devices having different $V_T$'s are formed on the same substrate, for instance two, three, four or more types of CMOS devices each having different VT's. Such devices are referred to as multi-$V_T$ devices.

Traditionally, multi-$V_T$ has been implemented by implantation of for instance B or P into the channel of the devices. However, with the emergence of FINFET devices and the scaling of the fin widths, especially fin widths smaller than 10 nm, the impact of doping on the $V_T$ is reduced. Additionally, high channel doping levels result in lower mobility due to scattering and worse mismatch due to dopant fluctuations.

Therefore, there is a need in industry for alternative multi-$V_T$ solutions.

SUMMARY OF CERTAIN INVENTIVE ASPECTS

The following terms are provided solely to aid in the understanding of the disclosure.

Various embodiments of the disclosure refer to parameters of the semiconductor device, including threshold voltage ($V_T$), effective work function ($WF_{eff}$), or physical characteristics of the material(s) employed such as work function (WF), etc. The definitions as used throughout this document are summarized herein below.

As used herein, a work function (WF) of the gate electrode (often referred to as metal gate electrode or metal layer or metal control electrode) is an intrinsic property of the material. In general, the work function of a certain material (e.g. a metal layer) is a measure of the energy, in electron volts (eV), required to eject an electron from the material into the vacuum outside of the material, if the electron were initially at the Fermi level. The work function of the gate electrode may also be referred to as as-deposited work function or the intrinsic work function of the material.

As used herein, an effective work function ($WF_{eff}$) of a gate stack (device) refers to a modified WF of the gate stack, and is a parameter that can be tuned (adjusted/modified) by, e.g., the choice of the gate dielectric material(s), gate electrode material(s) and gate processing, among others.

For a silicon substrate, the gate electrode of a negative channel MOSFET (NMOS) device can have an n-type effective work function of approximately 4.0 eV-4.4 eV, e.g., 4.2 eV, and the gate electrode of a positive channel MOSFET (or PMOS) device would have a p-type effective work function of approximately 4.8 eV-5.2 eV, e.g., 5.0 eV.

As used herein, a high-k dielectric refers to a dielectric featuring a relative permittivity ($\kappa$) higher than the relative permittivity of $SiO_2$, i.e. $\kappa > 3.9$. High-k dielectrics allow for a larger physical thickness (compared to $SiO_2$) for obtaining the same effective capacitance than can be obtained with a much thinner $SiO_2$ layer. Having higher physical thickness for the same capacitance can provide advantages such as, for example, reduced leakage current. A high-k dielectric can include one or more layers each comprising or consisting of materials such as $HfO_2$, $ZrO_2$, $Al_2O_3$, $La_2O_3$, $Gd_2O_3$, or other rare earth metal oxides, or metal oxide silicates such as, for example $HfSiO_x$ or $LaSiO_x$. The gate dielectric may comprise a stack of dielectric materials, such as for example a high-k material (e.g. $HfO_2$) formed on top of an (optional) interfacial dielectric layer (e.g. $SiO_2$) between the substrate and a high-k material.

In the following, certain embodiments of the present disclosure will be described with reference to a silicon (Si) substrate but it should be understood that these embodiments apply equally well to other semiconductor substrates. In embodiments, the "substrate" may include a semiconductor substrate such as e.g. a silicon, a gallium arsenide (GaAs), a gallium arsenide phosphide (GaAsP), an indium phosphide (InP), a germanium (Ge), an indium gallium arsenide (InGaAS) or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-insulator (SOI), silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

The process of manufacturing the semiconductor transistor is preferably done using a gate-last approach. In a gate-last approach, also often referred to as replacement-metal-gate (RMG) approach, the metal gate deposition occurs after the activation anneals (i.e. junction activation, source/drain activation). In a gate-first approach the metal gate is deposited on a high-k gate dielectric prior to the activation anneals, such that the high-k gate dielectric and metal gate is exposed to high temperatures (temperatures up to 1000 degrees Celsius or higher), which could be detrimental for the proper working of the device. In a gate-last approach, the metal of the metal gate is thus not exposed to these high temperatures. The process of manufacturing the semiconductor transistors according to embodiments of the present disclosure may be done according to the gate-last approach. A sacrificial gate electrode layer is provided on the gate dielectric layer. Spacers are provided on the sidewalls of the patterned sacrificial gate electrode layer. The spacers preferably comprise an insulating material such as for example silicon dioxide ($SiO_2$), silicon nitride (SiN) or silicon oxynitride (SiON) or a low-k dielectric layer such as for example SiCN, SiOCN, BN or SiBCN. Spacers may be deposited by ALD or CVD and patterned by anisotropic etching, or any other suitable method known to a person skilled in the art.

In a following process, the sacrificial gate electrode material in the gate stack is removed. After removing the sacrificial gate electrode material, the underlying gate dielectric layer is exposed in the region. The removal of the sacrificial gate electrode material may be done using an etching process which is selective towards the underlying gate dielectric material. More specifically first a dielectric layer may be formed. The formation of the dielectric layer may be done for example by depositing the dielectric layer using CVD, followed by polishing back (e.g. using CMP) the dielectric layer to expose the sacrificial gate electrode material in the gate region. The dielectric layer forms a protective layer for protecting the underlying source/drain regions and spacers during the subsequent etching process for removing the sacrificial gate electrode material. After removing the sacrificial gate electrode material, a trench in the gate region is formed in between the sidewall spacers. After removal of the sacrificial gate electrode material, the gate dielectric layer is still present in the gate stack.

The processes of removing the sacrificial gate electrode material after the source/drain activation, are well known to the skilled person as part of the so-called gate-last approach or also often referred to replacement metal-gate approach (RMG). The gate-last approach is, to the contrary of a conventional gate-first approach, considered a low-temperature process because the metal gate deposition occurs after the activation anneals (i.e. source/drain activation).

It is an aim of the present disclosure to provide a method for manufacturing a semiconductor device, for instance a CMOS device, comprising transistors each having a different work function arranged along a main surface of a substrate, comprising:

providing at least two channel regions in the substrate;
providing a dielectric layer on the substrate;
providing openings in the dielectric layer thereby exposing the channel regions and thereby providing corresponding gate regions on the channel regions;
providing a gate dielectric layer in the openings on the gate regions;
providing on the gate dielectric layer on each of the gate regions a barrier layer stack having different thickness along the different gate regions;
providing a gate filling stack of metal layers on the barrier layer stack in each of the gate regions;
wherein providing the barrier layer stack comprises:
providing a first barrier layer on the gate dielectric layer in the openings on each of the gate regions;
selectively removing the first barrier layer in a subset of the gate regions (removing a first portion of the first barrier layer), leaving the first barrier layer on at least a complementary subset of the gate regions (leaving a second portion of the first barrier layer);
and repeating at least once the step of:
providing a subsequent barrier layer in the openings on each of the channel regions;
selectively removing the subsequent barrier layer in a respective subset of the channel regions (removing a respective first portion of the subsequent barrier layer), leaving the respective subsequent barrier layer in a respective complementary subset of the channel regions (leaving a respective second portion of the subsequent barrier layer); such that barrier layer stacks having different thickness along different gate regions are provided.

According to embodiments, providing a dielectric layer on the substrate comprises providing a dielectric embedding layer embedding sacrificial gate structures arranged above respective gate regions, preferably followed by performing a flattening step in order to reduce the dielectric embedding layer's thickness and to expose these sacrificial gate structures.

According to embodiments, providing openings in the dielectric layer thereby providing corresponding gate regions on the channel regions, comprises removing at least a portion, for instance the poly-silicon layer or all of the sacrificial gate structures (except for the underlying high-k dielectric layer and underlying gate dielectric layer, possibly also etch stop layer, in a "high-k dielectric layer first" flow). The spacer structures are hereby not removed. Preferably, embodiments of the present disclosure are applied in a replacement metal-gate (RMG) approach.

For the purpose of the present description, a barrier layer or barrier layer stack is a layer or layer stack which is provided directly on top of the high-k dielectric layer or layer stack. Preferably the barrier layer or layer stack is also in between the high-k dielectric layer or layer stack and a lowest layer of any gate structure on the substrate which comprises or consists of a low work function metal and which causes a reduction of the effective work function of that gate structure. Such a low work function metal can be aluminum or TiAl. This first layer can comprise Aluminum, for instance it can be an aluminum layer or TiAl layer. A barrier layer or barrier layer stack is preferably suitable for reducing or blocking diffusion of the low work function metal (for instance the Aluminum from the Al comprising layer) towards the substrate. The skilled person will recognize that the nature, e.g. constitution and/or thickness, of the barrier layer or barrier layer stack influences the effective work-function of a respective gate structure.

According to embodiments, the barrier layers are provided in a conformal way. Each of the barrier layers preferably has a constant thickness, at least in the gate regions.

According to certain embodiments, the second portion of a subsequent barrier layer, the subsequent barrier layer directly following on a previous barrier layer, covers at least all gate regions associated to the second portion of the previous barrier layer.

According to embodiments of the present disclosure, the method comprises repeating only once, only twice, only three times or more times the steps of:
  providing a subsequent barrier layer in the openings on each of the channel regions;
  selectively removing the subsequent barrier layer in a respective subset of the channel regions (removing a respective first portion of the subsequent barrier layer), leaving the subsequent barrier layer in a respective complementary subset of the channel regions (leaving a respective second portion of the subsequent barrier layer).

According to embodiments of the present disclosure, the one or more barrier layers each comprise TiN or TaN.

According to embodiments of the present disclosure, the different barrier layers have the same constitution. For instance, all barrier layers can comprise or consist of TiN, or all can comprise or consist of TaN. Each of the barrier layers preferably has a thickness within the range of 0.5 nm to 3 nm, at least in the gate region. The total thickness of the barrier layer or barrier layer stack is preferably within the range of 0.5 nm to 6 nm, or within the range of 1 nm to 3 nm.

According to embodiments of the present disclosure, the barrier layers have a different constitution. For instance, a first barrier layer can comprise TiN, while a second barrier layer, directly below or above the first barrier layer, can comprise TaN.

According to embodiments of the present disclosure, the gate filling stack of metal layers comprises layers comprising or consisting of TiN, TiAl, Al, TiC, Co, W. It will be appreciated by the skilled person that in the context of the field of the present disclosure, filling layers are known as layers which fill the openings in the dielectric layer, but which do not affect the effective work-function of the gate structure anymore. For the purpose of the present description though, the gate filling stack of metal layers may comprise such filling layers, but may also comprise layers which do affect the effective work function of the gate structure (the latter also known as tuning layers).

According to embodiments of the present disclosure, the method comprises providing metal layer of said gate filling metal layer stack, the metal layer comprising TiAl or Al, and
  providing a TiN layer on top, preferably directly on top, of the metal layer;
  patterning the TiN layer above at least one gate region;
  selectively removing the metal layer from at least one gate region by using the patterned TiN layer as a mask;
  providing a further metal layer of the gate filling stack of metal layers in that gate region.

According to embodiments of the present disclosure, patterning the TiN layer comprises resist patterning.

According to embodiments of the present disclosure, the method further comprises performing a flattening step on the substrate, for instance up until a level defined by the dielectric layer.

According to embodiments of the present disclosure, the channel structures have a channel length smaller than 20 nm.

According to embodiments of the present disclosure, providing one or more barrier layers is performed by Atomic Layer Deposition (ALD).

BRIEF DESCRIPTION OF THE DRAWINGS

The disclosure will be further elucidated by means of the following description and the appended figures.

FIGS. 1.1 to 1.6 illustrate a process flow according to embodiments of the present disclosure of the type nMOS first-DUAL $V_T$ by applying the barrier layer first.

FIGS. 2.1 to 2.8 illustrates a process flow according to embodiments of the present disclosure of the type nMOS first-multiple $V_T$ by applying barrier first, whereby three different $V_T$ values are created.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

In the Figures, reference is made to relative threshold voltages ($V_T$). For example, reference may be made to very high $V_T$ (VHVT), high $V_T$ (HVT), standard $V_T$ (SVT), low $V_T$ (LVT) and very low $V_T$ (VLVT). While the absolute values of the voltages may depend on the application, it will be understood that in terms of voltage magnitudes, VHVT is generally greater than HVT, HVT is generally greater than SVT, SVT is generally greater than LVT and LVT is generally greater than VLVT, for a given transistor type (i.e., pMOS or nMOS).

FIGS. 1.1-1.6 illustrate a process flow according to embodiments of the present disclosure, referred to herein as nMOS first-DUAL $V_T$ process flow, in which the barrier layer is formed first. Assuming that nMOS and pMOS devices are to be provided on a common substrate, a so-called pMOS-first type of flow is used in the prior art, whereby the p-type work function metal (WFM) is deposited first and selectively removed from the areas selected for the nMOS devices, followed by an n-type WFM deposition. In the nMOS-first process, according to embodiments, the n-type WFM is deposited first and selectively removed from the areas selected for pMOS devices. The terms "nMOS first" or "pMOS first" thus refer to the chronological order in which the WFMs are deposited.

FIG. 1.1 represents an intermediate structure of a process flow according to a first embodiment. The dotted line illustrates a plane along which the cross-section is taken for FIGS. 1.2a to 1.6.

The intermediate structure of FIG. 1.1 can be the result of the following illustrative example process, or similar state of the art processes. In the illustrative example, a substrate is provided, for instance a silicon substrate. On the substrate a dielectric layer and sacrificial electrode layer is provided. The resulting so called sacrificial gate-stack is patterned and etched to the desired dimensions to thereby define sacrificial gate structures. Following this, source/drain extension and halo implantations are provided by for example implantation. Different implant species can be used for the nMOS and pMOS devices. Dielectric spacer structures can then be provided adjacent to the patterned sacrificial-gate stack, for instance by providing a spacer dielectric layer which can be for instance deposited and etched. This can be followed by a second implantation step to form the deep source/drain regions in a similar manner to the extension implantations. A dielectric embedding layer can be applied, for instance an ILD0 layer, and a flattening step as for instance a chemical mechanical polishing (CMP) process can be performed to expose the sacrificial gate structures. This dielectric layer can for instance comprise or consist of $SiO_2$ or $Si_3N_4$ or a low-k dielectric as for instance SiCN, SiOCN, BN, or SiBCN, to name a few. The sacrificial gate structures can be selectively removed, defining the respective gate or channel regions in the substrate. The dielectric layer thus typically comprises spacer structures adjacent to and defining the respective gate regions. These spacer structures are not depicted but are assumed to be part of the dielectric layer for reasons of simplicity of disclosure. Then, the final gate stack is provided, starting for instance with the provisioning of an interface layer consisting for example of $SiO_2$ and a high-k dielectric layer in the gate region. A first barrier layer comprising TiN is then provided, resulting in the reference structure illustrated in FIG. 1.1.

An aspect of the present disclosure is to provide barrier layers, or barrier layer stacks, which have different thicknesses for different transistor structures arranged along the same substrate. These transistor structures can be used as circuit elements or logic gates when forming CMOS devices.

FIGS. 1.2.a to 1.4 represent intermediate structures that illustrate further processing steps that are common to nMOS and pMOS regions, and define structures that can be used to fabricate transistors having a low $V_T$ (LVT) and/or a high $V_T$ (HVT). On the TiN surface of the intermediate structure of FIG. 1.1, a photoresist (PR) is coated (FIG. 1.2.a), and is patterned (FIG. 1.2.b), in order to open up the LVT gate region to expose the TiN therein. From this region, the previously formed TiN layer (first barrier layer) is removed by etching (FIG. 1.2.c), for instance by making use of an $SF_6$ based dry etching process. The PR is removed (FIG. 1.2.d) and a second barrier layer, for instance a TiN layer is provided on both the LVT and HVT gate regions (FIG. 1.3). Because the TiN layer is selectively removed from the LVT gate region in FIG. 1.2.d while not removed in the HVT gate region, the second TiN layer provided over both the LVT and HVT gate regions results in different barrier layer thicknesses (or barrier layer stack thickness) between the LVT gate region and the HVT gate region (FIG. 1.3). Further layers, e.g., TiAl and TiN can be provided on the barrier layer stack of each of LVT and HVT gate regions, for instance a trilayer of TiN/TiAl/TiN, the latter layers including layers above TiAl, e.g., TiAl/TiN, being part of the gate filling stack of metal layers (FIG. 1.3). This results in a barrier layer with different thickness in the LVT and HVT gate regions. Next another PR layer is provided covering all transistor structures (FIG. 1.4.a). At this stage, different processing may be is applied in nMOS and pMOS regions. In the pMOS region, the PR is patterned to be removed from the pMOS LVT gate region only, while PR remains to cover other gate regions (FIG. 1.4.b) including gate regions of the nMOS region. In the PMOS region, exposed top TiN layer is etched by means of for instance an $SF_6$ based dry etching process to expose the underlying TiAl layer in the pMOS LVT region. After removal of the remaining part of the photoresist (FIG. 1.4.d), the exposed TiAl layer in the pMOS LVT region is etched by for instance a TMAH (tetramethylammonium hydroxide) etching process, whereby the TiN layer covering the other gate regions is functioning as a mask (FIG. 1.5). Finally, in some embodiments, an optional TiN layer and a filling metal layer comprising or consisting of W is provided (FIG. 1.6), followed by a flattening step up until the level of the front surface of the dielectric layer IDL0, for instance a CMP polishing step. The result is that nMOS and pMOS have different LVT gate stacks, while having identical HVT gate stacks.

Thus, referring to FIG. 1.6, in one embodiment, by having different thicknesses of the barrier layer stack, the work function (WF) and the resulting $V_T$ can be tuned to have different values for different transistor types. For example, in the illustrated embodiment, by having two TiN layers between the lowermost layer of the gate filling stack (e.g., TiAl layer) and the gate dielectric (e.g., $HfO_2$), an nMOS HVT transistor can have an absolute value of the $V_T$ that is higher by, e.g., 0.2 eV, 0.4 eV, or 0.6 eV, compared to an nMOS LVT transistor having one TiN layer, where each of the barrier layers has a thickness between 0.5 nm and 3 nm, and the total thickness of a barrier layer stack has a thickness between 0.5 nm to 6 nm or between 1 nm and 3 nm. Similarly, by having two TiN layers between the lowermost layer (e.g., TiAl layer) of the gate filling stack and the gate dielectric (e.g., $HfO_2$), a pMOS HVT transistor can have an absolute value of the $V_T$ that is higher by e.g., 0.2 eV, 0.4 eV, or 0.6 eV, compared to a pMOS LVT transistor having one TiN layer, where each of the barrier layers has a thickness between 0.5 nm and 3 nm, and the total thickness of a barrier layer stack has a thickness between 0.5 nm to 6 nm or between 1 nm and 3 nm.

FIG. 2 illustrates a process flow according to embodiments of the present disclosure of the type nMOS first-multiple $V_T$ by applying barrier first, whereby three different $V_T$ values are created.

FIG. 2.1 illustrates an intermediate structure of a process flow according to a second embodiment, which is identical to the intermediate structure described above with respect to FIG. 1.1 for the first embodiment. The dotted line illustrates a cross-section along which the cross-section is taken for the rest of the sub figures of FIG. 2.

FIGS. 2.2.a to 2.6.a represent intermediate structures that illustrate further processing steps common to nMOS and pMOS regions and define structures that can be used to fabricate transistors having low $V_T$ (LVT), standard $V_T$ (SVT) and a high $V_T$ (HVT). Three different gate structures (A, B, C) for the nMOS region and three different gate structures (A, B, C) for the pMOS region are eventually generated from the intermediate structure of FIG. 2.1. A photoresist (PR) is coated on the TiN layer (FIG. 2.2.a), and is patterned (FIG. 2.2.b), in order to open up the gate region B, while the gate regions A and C remain covered. In gate region B the previously formed TiN layer (first barrier layer) is removed by etching (FIG. 2.2.c), for instance by making use of an $SF_6$ based dry etching process. The PR is removed (FIG. 2.2.d) and a second barrier layer, for instance comprising TiN is provided on all of the A, B and C gate regions, resulting in a different barrier layer thickness for gate region B and an identical barrier layer thickness in gate regions A and C (FIG. 2.3). A photoresist (PR) is coated on the TiN layer (FIG. 2.4.a), and is patterned (FIG. 2.4.b), in order to open up the gate region A, while the gate regions B and C remain covered this time. The top TiN layer is etched by means of for instance an $SF_6$ based dry etching process to expose the underlying high-k dielectric in gate region A (FIG. 2.4.c). The remaining PR is stripped from the substrate, including from gate regions B and C (FIG. 2.4.d), resulting in a different barrier layer thickness in gate regions A (no barrier layer), B and C. Further layers of TiAl and TiN are provided on the barrier layer stack, for instance a trilayer of TiN/TiAl/TiN, the latter TiAl/TiN layers being part of the gate filling stack of metal layers (FIG. 2.5). This results in a different TiN barrier layer thickness in gate regions A, B and C. The TiAl layer can be seen as a further work function tuning layer. The thickness and the presence or the absence thereof will indeed influence the work function of the respective gate structure. Next another PR layer is provided covering all transistor structures (FIG. 2.6.a). From now the processing for the nMOS type gate areas A, B and C is at least partially different from the processing for the pMOS type gate regions, such that both nMOS and pMOS structures are depicted. The PR is patterned in order to expose the upper TiN layer in the pMOS gate region A (FIG. 2.6.b) and leave the PR in the regions nMOS A, B, C and pMOS B, C. A selective etch is performed removing the TiN layer in the pMOS gate region A only, thereby exposing the TiAl layer in the pMOS gate region A (FIG. 2.6.c). The PR is again completely stripped (FIG. 2.6.d).

Next, the TiAl metal layer is selectively removed from the pMOS gate region A by using the patterned TiN layer as a mask, for instance by TMAH etching (FIG. 2.7). Finally, an optional TiN layer (improving adhesion) and a filling metal layer comprising or consisting of W is provided (FIG. 2.8), followed by a flattening step up until the level of the front surface of the dielectric layer ILD0, for instance a CMP polishing step.

Thus, referring to FIG. 2.8, in one embodiment, by having different thicknesses of the barrier layer stack, the work function (WF) and the resulting $V_T$ can be tuned to have different values for different transistor types. For example, in the illustrated embodiment, by having three TiN layers between the lowermost layer of the gate filling stack (e.g., TiAl layer) and the gate dielectric (e.g., $HfO_2$), an nMOS HVT transistor can have an absolute value of the $V_T$ that is higher by, e.g., 0.2 eV, 0.4 eV or 0.6 eV, compared to an nMOS SVT transistor having two TiN layers, where each of the barrier layers has a thickness between 0.5 nm and 3 nm, and the total thickness of a barrier layer stack has a thickness between 0.5 nm to 6 nm or between 1 nm and 3 nm. Similarly, by having two TiN layers between the lowermost layer of the gate filling stack (e.g., TiAl layer) and the gate dielectric (e.g., $HfO_2$), an nMOS SVT transistor can have an absolute value of the $V_T$ that is higher by, e.g., 0.2 eV, 0.4 eV or 0.6 eV, compared to an nMOS LVT transistor having one TiN layer, where each of the barrier layers has a thickness between 0.5 nm and 3 nm, and the total thickness of a barrier layer stack has a thickness between 0.5 nm to 6 nm or between 1 nm and 3 nm.

Similarly, in the illustrated embodiment, by having three TiN layers between the lowermost layer of the gate filling stack (e.g., TiAl layer) and the gate dielectric (e.g., $HfO_2$), a pMOS SVT transistor can have an absolute value of the $V_T$ that is higher by, e.g., 0.2 eV, 0.4 eV or 0.6 eV, compared to a pMOS HVT transistor having two TiN layers, where each of the barrier layers has a thickness between 0.5 nm and 3 nm, and the total thickness of a barrier layer stack has a thickness between 0.5 nm to 6 nm or between 1 nm and 3 nm. Similarly, by having two TiN layers between the lowermost layer of the gate filling stack (e.g., TiAl layer or a W layer) and the gate dielectric (e.g., $HfO_2$), p nMOS HVT transistor can have an absolute value of the $V_T$ that is higher by, e.g., 0.2 eV, 0.4 eV or 0.6 eV, compared to a pMOS LVT transistor having one TiN layer, where each of the barrier layers has a thickness between 0.5 nm and 3 nm, and the total thickness of a barrier layer stack has a thickness between 0.5 nm to 6 nm or between 1 nm and 3 nm.

The above described embodiments are set out based on process flows of the "high-k" last type, whereby the high-k dielectric layer is provided after having removed the sacrificial gate structure. Hereby, the sacrificial gate oxide is removed, and a new gate oxide is provided before applying such high-k dielectric layer. It will be appreciated that a similar flow can be applied in process flows of the "high-k" first type, whereby the final gate oxide and high-k layer are provided before providing the rest of the sacrificial gate structure, possibly with an extra etch stop layer on top of said high-k dielectric layer. When removing a portion of the sacrificial gate structure, the high-k dielectric layer and underlying gate oxide are maintained, possibly also the etch stop layer. The barrier layers having different thicknesses in different gate regions can though be applied in the same way as in the "high-k" last type of flow. It is a characteristic of the high-k first type of flow that the high-k dielectric layer is not provided/present on the sidewalls of the gate openings or trenches, the width of the latter having a relatively wider width when compared to those of the "high-k" last type of flow.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of manufacturing a semiconductor device comprising transistors each having a different work function arranged along a main surface of a substrate, the method comprising:
   providing at least two channel regions in the substrate;
   providing a dielectric layer on the substrate over the at least two channel regions;
   providing openings through the dielectric layer to expose portions of each of the at least two channel regions, thereby defining corresponding gate regions inside the openings and over the at least two channel regions;
   providing a gate dielectric layer on the exposed channel regions of each of the gate regions;
   providing on the gate dielectric layer of each of the gate regions a barrier layer stack each having a different thickness, wherein providing the barrier layer stack comprises:
  providing a first barrier layer on the gate dielectric layer of each of the gate regions;
  selectively removing the first barrier layer from a subset of the gate regions while leaving the first barrier layer in at least a complementary subset of the gate regions;
  repeating at least once the processes of:
  providing a subsequent barrier layer in each of the gate regions;
  selectively removing the subsequent barrier layer from a respective subset of the channel regions, while leaving the respective subsequent barrier layer in a respective complementary subset of the channel regions, such that barrier layer stacks having different thickness along different gate regions are provided; and
  providing a gate-filling stack of metal layers on the barrier layer stack in each of the gate regions.

2. The method according to claim 1, wherein providing the barrier layer comprises repeating only once the processes of:
  providing a subsequent barrier layer in each of the gate regions;
  selectively removing the subsequent barrier layer from a respective subset of the channel regions, while leaving the respective subsequent barrier layer in a respective complementary subset of the channel regions.

3. The method according to claim 1, wherein providing the barrier layer comprises repeating only twice the processes of:
  providing a subsequent barrier layer in each of the gate regions;
  selectively removing the subsequent barrier layer from a respective subset of the channel regions, while leaving the respective subsequent barrier layer in a respective complementary subset of the channel regions.

4. The method according to claim 1, wherein the first barrier layer and the subsequent barrier layer comprise one or both of TiN and TaN.

5. The method according to claim 1, wherein the first barrier layer and the subsequent barrier layer are formed of the same material.

6. The method according to claims 1, wherein the first barrier layer and the subsequent barrier layer are formed of a different material.

7. The method according to claim 1, wherein providing the gate-filling stack of metal layers comprises providing a metal selected from the group consisting of TiN, TiAl, Al, TiC, Co, W and combinations thereof.

8. The method according to claim 7, wherein providing the gate-filling stack of metal layers comprises providing a metal layer formed of TiAl or Al and further comprises:
  providing a TiN layer on the metal layer;
  patterning the TiN layer above at least one gate region;
  selectively removing the metal layer from at least one gate region by using the patterned TiN layer as a mask; and
  providing a further metal layer of the gate filling stack of metal layers in the at least one gate region.

9. The method according to claim 8, wherein patterning the TiN layer comprises resist patterning.

10. The method according to claim 1, further comprising performing a flattening step on the substrate, up until a level defined by the dielectric layer.

11. The method according to claim 1, wherein the exposed portions of the at least two channel regions define channel lengths smaller than 20 nm of the transistors.

12. The method according to claim 1, wherein providing the first barrier layer or the subsequent barrier layer comprises depositing using atomic layer deposition (ALD).

* * * * *